(12) United States Patent
Bleidistel et al.

(10) Patent No.: US 10,162,270 B2
(45) Date of Patent: Dec. 25, 2018

(54) PROJECTION EXPOSURE APPARATUS COMPRISING A MEASURING SYSTEM FOR MEASURING AN OPTICAL ELEMENT

(71) Applicant: Carl Zeiss SMT GMBH, Oberkochen (DE)

(72) Inventors: Sascha Bleidistel, Aalen (DE); Joachim Hartjes, Aalen (DE); Toralf Gruner, Aalen-Hofen (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 724 days.

(21) Appl. No.: 14/449,629

(22) Filed: Aug. 1, 2014

(65) Prior Publication Data

US 2014/0340664 A1    Nov. 20, 2014

Related U.S. Application Data

(63) Continuation of application No. PCT/EP2013/000200, filed on Jan. 23, 2013.
(Continued)

(30) Foreign Application Priority Data

Feb. 1, 2012    (DE) .................. 10 2012 201 410

(51) Int. Cl.
*G03B 27/68*    (2006.01)
*G03B 27/54*    (2006.01)
(Continued)

(52) U.S. Cl.
CPC .............. *G03F 7/706* (2013.01); *G01K 11/00* (2013.01); *G01M 11/0242* (2013.01);
(Continued)

(58) Field of Classification Search
CPC ... G01K 11/00; G01K 11/06; G01M 11/0242; G01M 11/0271; G03F 7/70141;
(Continued)

(56) References Cited

U.S. PATENT DOCUMENTS 4,779,978 A * 10/1988 Hatton ................. G01N 21/412
356/128
7,212,274 B2    5/2007 Hara et al.
(Continued)

FOREIGN PATENT DOCUMENTS

CN    101802577 A    8/2010
CN    102007392 A    4/2011
(Continued)

OTHER PUBLICATIONS

Office Action in corresponding Chinese Application No. 2013800119724, dated Dec. 15, 2015, along with an English translation.
(Continued)

*Primary Examiner* — Christina Riddle
(74) *Attorney, Agent, or Firm* — Edell, Shapiro & Finnan, LLC

(57) ABSTRACT

A projection exposure apparatus (10) for microlithography has a measuring system (50) for measuring an optical element of the projection exposure apparatus. The measuring system (50) includes an irradiation device (54), which is configured to radiate measuring radiation (62) in different directions (64) onto the optical element (20), such that the measuring radiation (62) covers respective optical path lengths (68) within the optical element (20) for the different directions (64) of incidence, a detection device (56), which is configured to measure, for the respective directions (64) of incidence, the respective optical path lengths covered by the measuring radiation (62) in the optical element (20), and
(Continued)

an evaluation device, which is configured to determine a spatially resolved distribution of refractive indices in the optical element (20) by computed-tomographic back projection of the respective measured path lengths with respect to the respective directions of incidence.

25 Claims, 8 Drawing Sheets

Related U.S. Application Data

(60) Provisional application No. 61/593,349, filed on Feb. 1, 2012.

(51) Int. Cl.
*G03F 7/20* (2006.01)
*G01M 11/02* (2006.01)
*G01K 11/00* (2006.01)

(52) U.S. Cl.
CPC ....... *G01M 11/0271* (2013.01); *G03F 7/7085* (2013.01); *G03F 7/70141* (2013.01); *G03F 7/70258* (2013.01); *G03F 7/70891* (2013.01)

(58) Field of Classification Search
CPC .. G03F 7/70258; G03F 7/70266; G03F 7/706; G03F 7/7085; G03F 7/70891; G03F 7/7095; G03F 7/70958
USPC ............... 355/30, 52, 53, 55, 67–71, 77; 250/492.1, 492.2, 492.22, 492.23, 493.1, 250/548; 356/32, 33, 34, 35.5, 51, 481, 356/496, 503, 504, 511, 542, 513, 515, 356/517, 128, 625, 627, 630–632
See application file for complete search history.

(56) References Cited

U.S. PATENT DOCUMENTS

| | | |
|---|---|---|
| 2001/0019403 A1 | 9/2001 | Schuster et al. |
| 2005/0110967 A1 | 5/2005 | Hara et al. |
| 2006/0244940 A1 | 11/2006 | Uehara |
| 2007/0195317 A1 | 8/2007 | Schottner et al. |
| 2009/0284831 A1* | 11/2009 | Schuster .............. G02B 5/3091 359/355 |
| 2010/0135356 A1 | 6/2010 | Schulz |
| 2011/0051127 A1 | 3/2011 | Kusaka et al. |

FOREIGN PATENT DOCUMENTS

| | | |
|---|---|---|
| DE | 102006003375 A1 | 8/2007 |
| DE | 102007030398 A1 | 1/2009 |
| EP | 1521155 A2 | 4/2005 |
| JP | H09232213 A | 9/1997 |
| JP | 2001021448 A | 1/2001 |
| JP | 2001196305 A | 7/2001 |
| JP | 2005109158 A | 4/2005 |
| WO | 2005022614 A1 | 3/2005 |
| WO | 2009039883 A1 | 4/2009 |
| WO | 2011092020 A2 | 8/2011 |
| WO | 2012069351 A1 | 5/2012 |

OTHER PUBLICATIONS

Office Action in corresponding Korean Application No. 1020147021284, dated May 26, 2016, along with an English translation.
Office Action in corresponding Korean Application No. 1020147021284, dated Jul. 10, 2015, along with an English translation.
International Search Report in counterpart International Application No. PCT/EP2013/000200, dated Feb. 7, 2013.
Written Opinion in counterpart International Application No. PCT/EP2013/000200, dated Feb. 7, 2013.
Office Action in corresponding Japanese Application No. 2014-555119, dated Sep. 15, 2015, along with an English translation.

* cited by examiner

PROJECTION EXPOSURE APPARATUS COMPRISING A MEASURING SYSTEM FOR MEASURING AN OPTICAL ELEMENT

The present application is a Continuation of International Application PCT/EP2013/000200, with an international filing date of Jan. 23, 2013, which was published under PCT Article 21(2) in English, and the complete disclosure of which is incorporated into the present application by reference. This continuation application claims priority to German Patent Application No. 10 2012 201 410.1 filed Feb. 1, 2012 and to U.S. Provisional Application No. 61/593,349 filed Feb. 1, 2012. The entire disclosures of this German Patent Application and this U.S. Provisional Application are incorporated into the present application by reference.

FIELD OF AND BACKGROUND OF THE INVENTION

The invention relates to a projection exposure apparatus for microlithography comprising a measuring system, and to a method for measuring an optical element.

In order to operate a projection exposure apparatus economically, it is desirable to image mask structures onto a substrate in the form of a semiconductor wafer with an exposure time that is as short as possible, in order thus to achieve a throughput of exposed substrates that is as high as possible. This necessitates high radiation intensities for achieving a sufficient exposure of each individual one of the substrates. Particularly when using radiation in the ultraviolet or extreme ultraviolet (EUV) wavelength range, the influence of intensive radiation can have the effect that the temperature in the individual optical elements in the projection lens and the illumination optical unit of the projection exposure apparatus varies locally, which in turn influences the surface form and the refractive index of the optical elements. Temperature distribution and refractive index distribution can also vary temporally in the optical elements.

These radiation-induced changes in the properties of the individual optical elements can lead to deviations in the imaging behavior of the projection exposure apparatus. Changes in the properties of optical elements in the projection lens are manifested as aberrations of the projection lens. The extent of these aberrations depends on the radiation dose. Examples of effects of high radiation intensity in a lens element include densification and reduction of density of the lens element material. With the use of 193 nm radiation, a particularly great change in density is observed in quartz glass. Such effects are usually designated and also known as so-called "lens heating" effects.

The aberrations produced by lens heating change the imaging behavior of the projection lens generally continuously during the operation of the projection exposure apparatus. This detrimentally affects the quality of the lithographic imaging. In order to ensure a uniformly high imaging quality, it is conventional practice in many cases for the exposure operation of the projection exposure apparatus to be interrupted at regular time intervals in order to check the imaging behavior. However, such interruptions are costly since they result in a reduction of the throughput.

OBJECTS AND SUMMARY OF THE INVENTION

One object addressed by the invention is that of providing a projection exposure apparatus and a method whereby the abovementioned problems are solved, and, in particular, it is possible to achieve a uniformly high imaging quality of the projection exposure apparatus in conjunction with a high throughput.

The abovementioned objects are addressed in accordance with one formulation of the invention, by a projection exposure apparatus for microlithography which comprises a measuring system for measuring an optical element of the projection exposure apparatus. The optical element can be, for example, a lens element or also a mirror element. The projection exposure apparatus comprises an illumination optical unit and a projection lens. The optical element to be measured can be part of the illumination optical unit or of the projection lens. The measuring system comprises an irradiation device, which is configured to radiate measuring radiation in different directions onto the optical element, such that the measuring radiation covers a respective optical path length within the optical element for the different directions of incidence. Furthermore, the measuring system comprises a detection device and an evaluation device. The measuring system is configured to measure, for the respective direction of incidence, the corresponding optical path length covered by the measuring radiation in the optical element. The evaluation device is configured to determine a spatially resolved distribution of the refractive index in the optical element by computed-tomographic back projection of the measured path lengths taking account of the respective direction of incidence.

In other words, the measuring system according to the invention operates on the basis of a computed-tomographic measuring principle and can thus be embodied, in particular, as a tomography measuring system. In a computed-tomographic measurement, the object to be measured is measured in different directions and the internal spatial structure of the object to be measured is determined from the measurements and represented for example in the form of slice images. The measuring system according to the invention determines a spatially resolved distribution of the optical refractive index of the optical element from the measurements carried out in different directions. The spatially resolved distribution can be determined one-dimensionally, two-dimensionally or three-dimensionally, depending on the embodiment. From the determined spatially resolved distribution of the refractive index, in the case where the optical element is a lens element, the optical behavior of the lens element can be deduced directly. In the case where the optical element is a mirror element, a spatially resolved distribution of the refractive index of the mirror substrate can be measured, for example. Changes to the mirror surface can then be deduced from this distribution. Furthermore, a temperature distribution of the optical element can be determined, for example.

The respective optical path length results from a projection of the refractive index of the optical element along the path covered by the measuring radiation for the corresponding direction of incidence in the optical element onto the detection device. The computed-tomographic back projection according to the invention is effected in particular, as filtered back projection. This method is based on the Radon transform and is known to the person skilled in the art in principle e.g. from medical computed tomography. The back projection is effected, in particular, onto an at least two-dimensional region of the optical element. The spatially resolved distribution of the refractive index can then be determined two-dimensionally therefrom.

During the measurement of the optical element, the measuring radiation is radiated onto the optical element in different directions. Different directions are understood to be, in particular, directions which differ from one another by an angle of at least 1°, at least 5° or at least 10°.

The measurement of the optical element in different directions according to the invention can be effected, for example, via the edge of the optical element. This makes it possible to carry out the measurement without interrupting the exposure operation of the projection exposure apparatus. It thus becomes possible to monitor the spatially resolved distribution of a property crucial to the imaging behavior of the projection exposure apparatus during the operation of the projection exposure apparatus. This in turn makes it possible to correct possible deviations in the imaging behavior from a desired state even during exposure operation, for example by using manipulators. The invention thus makes possible a uniformly high imaging quality without throughput-reducing interruptions of exposure operation.

In accordance with one embodiment according to the invention, the evaluation device is configured to project the measured path lengths back onto a volume region of the optical element through which the measuring radiation passes, and thus to determine a three-dimensionally spatially resolved distribution of the refractive index in the optical element.

In accordance with a further embodiment according to the invention, the measured optical element is a lens element. In particular, in this case the projection exposure apparatus is designed for exposure with UV radiation, such as, for instance, radiation having a wavelength of approximately 365 nm, approximately 248 nm or approximately 193 nm. Furthermore, the measured optical element can be embodied as a diffracting or scattering element.

In accordance with a further embodiment according to the invention, the measuring system is configured to measure the optical element in at least two different directions extending transversely with respect to the optical axis of the optical element. The measurement is thus effected from an edge region of the optical element, that is to say that a used beam path relating to the optical element is not adversely affected by the measurement.

In accordance with a further embodiment according to the invention, the measuring system is configured to determine from the measurements a spatially resolved distribution of the temperature in at least one section of the measured optical element. This is done by evaluation of the measured spatially resolved distribution of the refractive index of the optical element on the basis of a known temperature dependence of the refractive index of the material through which radiation is passed.

In accordance with a further embodiment according to the invention, the detection device comprises an interferometer configured, for the purpose of optical path length measurement, to superimpose the measuring radiation after traversing one of the optical path lengths in the optical element with a reference radiation. In accordance with one variant, the reference radiation is branched off from the measuring radiation prior to the entry thereof into the optical element.

In accordance with a further embodiment according to the invention, the irradiation device comprises a plurality of irradiation units each configured and arranged to emit the measuring radiation in one of the different directions of incidence, wherein the directions of incidence of the different irradiation units differ from one another in pairs. In other words, the irradiation units emit the measuring radiation in each case in mutually different directions of incidence.

In accordance with a further embodiment according to the invention, the detection device comprises a plurality of detection units each configured to measure the optical path length for a respective one of the different directions of incidence, wherein the directions of incidence assigned to the different detection units differ from one another in pairs.

In accordance with a further embodiment according to the invention, the measuring system comprises at least one integrated measuring module configured to radiate the measuring radiation onto the optical element in one of the different directions and to measure the measuring radiation returning in a direction opposite to the direction of incidence. The integrated measuring module thus has the function of the irradiation device and the function of the detection device with regard to one of the different directions of incidence. In accordance with one embodiment, the measuring system has a plurality of integrated measuring modules, in each of which an irradiation unit and a detection unit are integrated. The integrated measuring module is preferably fashioned compactly in such a way that it extends only on one side of the optical elements being measured.

In accordance with a further embodiment according to the invention, the measuring system comprises at least one irradiation unit for radiating the measuring radiation onto the optical element and also a detection unit for measuring the optical path length covered by the measuring radiation in the optical element. In accordance with this embodiment, the irradiation unit and the detection unit are arranged on opposite sides of the optical element.

In accordance with a further embodiment according to the invention the irradiation device comprises an irradiation unit for emitting the measuring radiation and the detection device comprises a detection unit assigned to the irradiation unit and serving for measuring the path length covered by the measuring radiation in the optical element. The measuring system furthermore has a rotary bearing, to which the irradiation unit and the detection unit are fixed. The rotary bearing is configured in such a way that, in different rotary positions of the rotary bearing, the measuring radiation emitted by the irradiation unit is radiated onto the optical element in the different directions, and the detection unit is arranged for measuring the measuring radiation emitted by the irradiation unit in the respective rotary position.

According to a further formulation, the invention furthermore provides a projection exposure apparatus for microlithography comprising a measuring system, described below, for measuring an optical element of the projection exposure apparatus. The measuring system comprises an irradiation device, which is configured to radiate measuring radiation in different directions onto the optical element, such that the measuring radiation covers a respective optical path length through at least one section of the optical element for the different directions of incidence. Furthermore, the measuring system comprises a detection device, which is configured to measure, for the respective direction of incidence, the corresponding optical path length covered by the measuring radiation in the optical element, and an evaluation device, which is configured to determine a three-dimensionally spatially resolved distribution of a property of the optical element from the measured path lengths taking account of the respective direction of incidence. This projection exposure apparatus can optionally be provided with features mentioned in the above embodiments and exemplary embodiments. In particular, the determined property of the optical element can be the refractive index thereof.

Furthermore, the invention provides a projection exposure apparatus for microlithography comprising a measuring system, wherein the measuring system comprises at least one infrared sensor configured to measure a respective intensity of an infrared radiation emerging from the optical element from different directions, and the measuring system is configured to determine from the measurements a spatially resolved distribution of a property of the optical element. This projection exposure apparatus, too, can, if applicable, optionally be provided with features mentioned in the above embodiments and exemplary embodiments.

As is known to the person skilled in the art, the intensity of the infrared radiation emitted by the individual volume elements of the optical element is proportional to the fourth power of the temperature of the respective volume element. In accordance with one embodiment according to the invention, the measuring system is configured to determine from the measurements a spatially resolved distribution of the temperature in at least one section of the optical element.

In accordance with a further embodiment according to the invention, the projection exposure apparatus furthermore comprises a manipulation device for changing an optical property of the projection exposure apparatus. Furthermore, the projection exposure apparatus comprises a control device configured to change the optical property, in particular the aberration effects of the optical element, in the projection exposure apparatus, with the manipulation device based on the spatially resolved distribution of the measured property of the optical element.

According to yet another formulation, the invention furthermore provides a method for measuring an optical element of a projection exposure apparatus for microlithography. In accordance with this method, measuring radiation is radiated onto the optical element in different directions, such that the measuring radiation covers a respective optical path length through at least one section of the optical element for the different directions of incidence. Furthermore, for the respective direction of incidence, the corresponding optical path length covered by the measuring radiation in the optical element is measured, and a spatially resolved distribution of the refractive index in the optical element is determined by computed-tomographic back projection of the measured path lengths taking account of the respective direction of incidence.

In accordance with one embodiment of the method according to the invention, the optical element during the measurement is part of a projection exposure apparatus for microlithography. In other words, the optical element is measured in the state incorporated into the projection exposure apparatus. In accordance with a further embodiment according to the invention, an optical property of a projection exposure apparatus comprising the optical element is changed on the basis of the spatially resolved distribution of the measured property of the optical element.

In accordance with a further embodiment according to the invention, for the purpose of optical path length measurement, the measuring radiation after traversing one of the optical path lengths in the optical element is superimposed with a reference radiation. In accordance with a further embodiment according to the invention, the measuring radiation is emitted in one of the different directions of incidence, wherein the directions of incidence of the different irradiation units differ from one another in pairs. In accordance with a further embodiment according to the invention, the optical path length is measured for a respective one of the different directions of incidence, wherein the directions of incidence assigned to the different detection units differ from one another in pairs. In accordance with a further embodiment, the method according to the invention is carried out with a measuring system in one of the previous embodiments.

The features specified with regard to the above-explained embodiments of the projection exposure apparatus according to the invention and of the measuring system according to the invention can be correspondingly applied to the method according to the invention. Conversely, the features specified with regard to the above-explained embodiments of the method according to the invention can be correspondingly applied to the projection exposure apparatus according to the invention and to the measuring system according to the invention.

BRIEF DESCRIPTION OF THE DRAWINGS

The above and further advantageous features of the invention are illustrated in the following detailed description of exemplary embodiments according to the invention with reference to the accompanying schematic drawings, in which.

DETAILED DESCRIPTION OF EXEMPLARY EMBODIMENTS ACCORDING TO THE INVENTION

In the exemplary embodiments and embodiments described below, elements which are functionally or structurally similar to one another are as far as possible provided with the same or similar reference signs. Therefore, for understanding the features of the individual elements of a specific exemplary embodiment, reference should be made to the description of other exemplary embodiments or the general description of the invention.

Figure 1:
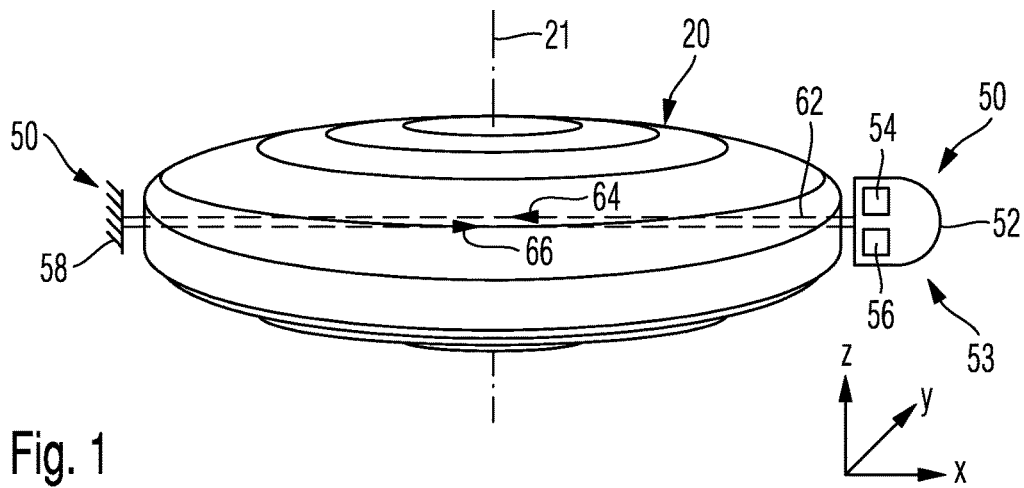
FIG. 1 shows a perspective illustration of an optical element of a projection exposure apparatus for microlithography in the form of a lens element with an illustration of a measuring arm of a measuring system for measuring the optical element in a first embodiment according to the invention.

In order to facilitate the description of the projection exposure apparatus, the drawing indicates a Cartesian xyz co-ordinate system that reveals the respective positional relationship of the components illustrated in the figures. In FIG. 1, the y-direction runs obliquely backward into the plane of the drawing, the x-direction runs toward the right and the z-direction runs upward.

FIG. 1 schematically illustrates an optical element 20 in the form of a lens element together with a measuring arm 53 of a measuring system 50. The measuring system 50 serves for measuring the optical element 20 and comprises a plurality of measuring arms 53 arranged in different directions, as described in greater detail below. The measuring arm 53 shown in FIG. 1 comprises an integrated measuring module 52 and a reflective element 58 in the form of a mirror. In accordance with one embodiment, the optical element 20 shown in FIG. 1 is part of a projection exposure apparatus 10 for microlithography, illustrated schematically in FIG. 2, in particular a projection lens 32 of the projection exposure apparatus 10. Alternatively, the optical element 20 can also be part of an illumination optical unit 16 of the projection exposure apparatus 10.

Figure 2:
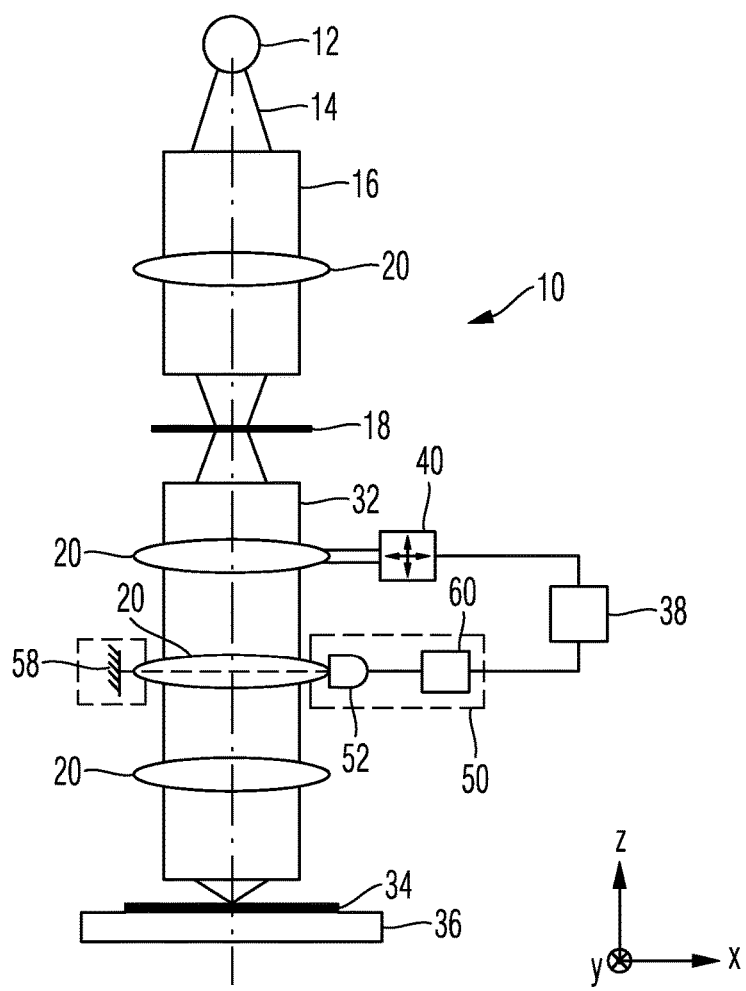
FIG. 2 shows a projection exposure apparatus for microlithography with a measuring system in accordance with FIG. 1 integrated therein.

The projection exposure apparatus 10 illustrated in FIG. 2 comprises a radiation source 12 for generating an exposure radiation 14 having, for example, a wavelength in the UV range, such as, for instance, 365 nm, 248 nm or 193 nm. The projection exposure apparatus 10 can be designed for EUV lithography. In this case, the exposure radiation 14 has a wavelength of less than 100 nm, in particular a wavelength of approximately 13.5 nm or approximately 6.8 nm. The exposure radiation 14 firstly passes through an illumination optical unit 16 having a plurality of optical elements 20 and thereupon impinges on a mask 18. The mask 18 comprises mask structures that are imaged, by a projection lens 32 likewise comprising a plurality of optical elements 20, onto a substrate 34 in the form of a wafer, said substrate being held by a substrate stage 36.

In the embodiment of a projection exposure apparatus 10 according to the invention as illustrated by way of example in FIG. 2, one of the optical elements 20 is provided with the measuring system 50 mentioned above. The measuring system 50 is configured to measure the assigned optical element 20 computed-tomographically at specific time intervals. For this purpose, the optical element 20 is measured in different directions. In the embodiment of the measuring system 50 as shown in FIG. 1, the refractive index n of the optical element 20 is the subject of the measurement. As the result of an individual measurement, the refractive index n of the optical element 20 is determined in at least one section of the optical element 20.

Figure 3:
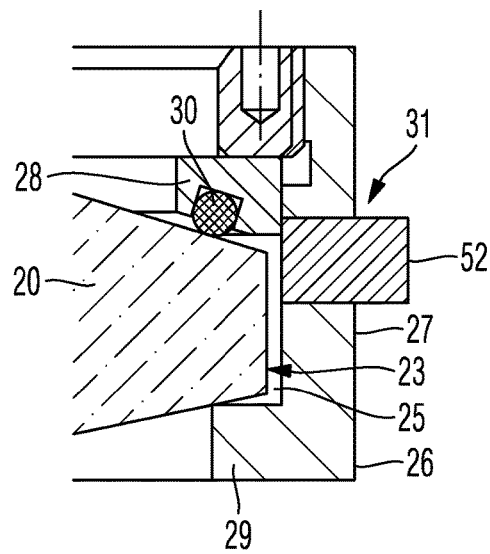
FIG. 3 shows a detail view of an embodiment of the lens element mount of the projection exposure apparatus in accordance with FIG. 2 with a measuring module of the measuring system integrated in the lens element mount.

FIG. 3 shows an embodiment of the arrangement of the measuring module 52 on one of the optical elements 20 in accordance with FIG. 2. In this embodiment, the optical element 20 is embodied as a lens element and is held by a lens element mount 26 fashioned as a clamping mount. For this purpose, the lens element mount 26 comprises an adjustable clamping jaw 28 and a fixed clamping jaw 29. The two clamping jaws 28 and 29 clamp the optical element 20 in at the edge thereof from the top and bottom, that is to say that the clamping jaws 28 and 29 grip the optical element 20 from both sides with regard to the thickness extent of the optical element 20. The clamping jaw 28 is provided with a bearing ball 30, which serves to ensure a certain flexibility in respect of the bearing. An edge region 23 of the optical element 20, the surface of which extends substantially parallel to the optical axis 21 of the optical element 20, has play relative to a side wall 27 of the lens element mount 26. In other words, a gap 25 is provided between the edge region 23 of the optical element 20 and the side wall 27 of the lens element mount 26. A cutout 31 is provided in the side wall 27, the measuring module 52 being arranged in said cutout. The measuring module 52 is thus arranged at a position at which the measuring radiation 62 emerging from an irradiation unit 54 of the measuring module 52 can penetrate into the optical element 20 in an unimpeded manner and the returning measuring radiation can be detected again with a detection unit 56 of the measuring module 52, as shown in FIG. 1. The arrangement of the reflective element 58 in the lens element mount 26 can be effected analogously to the arrangement of the measuring module 52 in accordance with FIG. 3.

Figure 4:
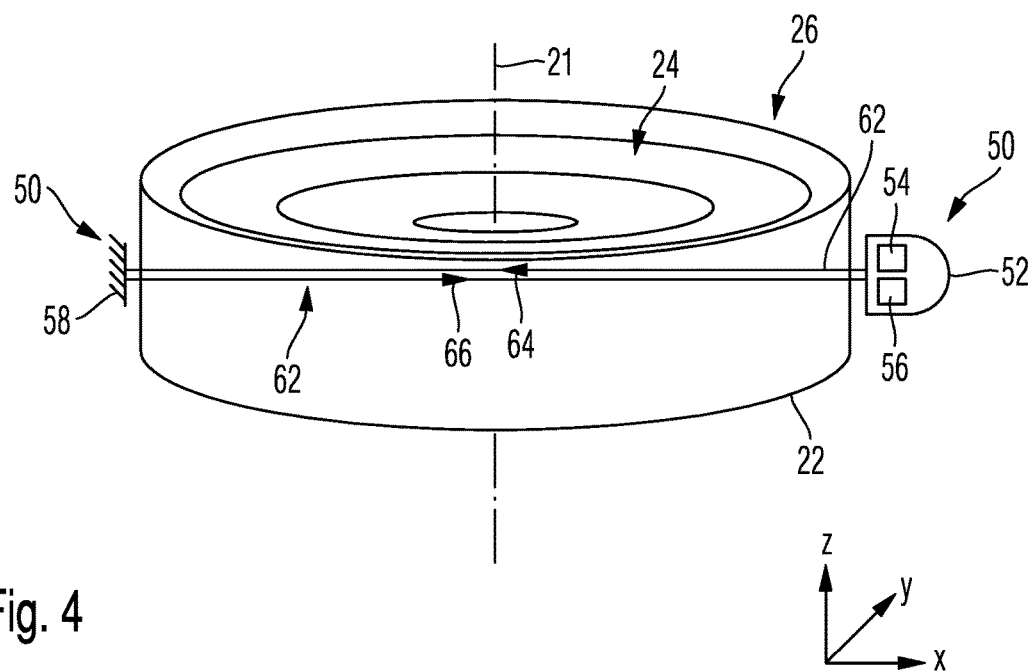
FIG. 4 shows a perspective illustration of an optical element of a projection exposure apparatus for microlithography in the form of a mirror with an illustration of a measuring arm of a measuring system for measuring the optical element in the first embodiment according to the invention.

As mentioned above, as the result of an individual measurement, the refractive index n of the optical element 20 is determined in at least one section of the optical element 20. In the case where the measured optical element 20 is a lens element, as shown in FIG. 1, the measured refractive index is the refractive index of the lens element material. As already mentioned above, the measured optical element 20 can also be a mirror element. Such a mirror element is illustrated in FIG. 4. This mirror element is designed for incorporation into an EUV projection exposure apparatus and thus serves for reflecting EUV radiation. For this purpose, the mirror element has a coating 24 that reflects EUV radiation. The coating 24 is applied on a concave surface of a mirror substrate 22. The mirror substrate 22 can be produced from ULE or Zerodur, for example. In the case of the measurement of the mirror element in accordance with FIG. 4, the refractive index n is measured with regard to the refractive index of the mirror substrate 22.

For the computed-tomographic measurement of an optical element 20 either in accordance with FIG. 1 or in accordance with FIG. 4, the measuring system 50 comprises a plurality of measuring arms 53 oriented in different directions and in each case transversely with respect to the optical axis 21 of the optical element 20. Such a measuring arm comprises an integrated measuring module 52 and a reflective element 58 in the embodiments shown in FIGS. 1 and 4.

As already mentioned above, the integrated measuring module 52 comprises an irradiation unit 54 and a detection unit 56. The irradiation unit 54 radiates the measuring radiation 52 onto the optical element 20 in a direction 64 of incidence that is oriented perpendicularly to the optical axis 21 of the optical element 20. The measuring radiation 62 has a wavelength at which the lens element material or the material of the mirror substrate 22 is transparent. For this purpose, the measuring radiation 62 can be radiated onto an outer edge region of the optical element 20. In any case the measuring radiation 62 passes through at least one section of the optical element 20, emerges again from the latter and is thereupon reflected by the reflective element 58 back into the optical element 20. After reflection, the measuring radiation 62 runs in a return direction 66 which, in accordance with one embodiment, is opposite to the direction 64 of incidence.

The returning measuring radiation 62 is thereupon detected by a detection unit 56 of the measuring module 52. The detection unit 56 determines the optical path length covered by the measuring radiation 62 in the optical element 20.

Figure 5:
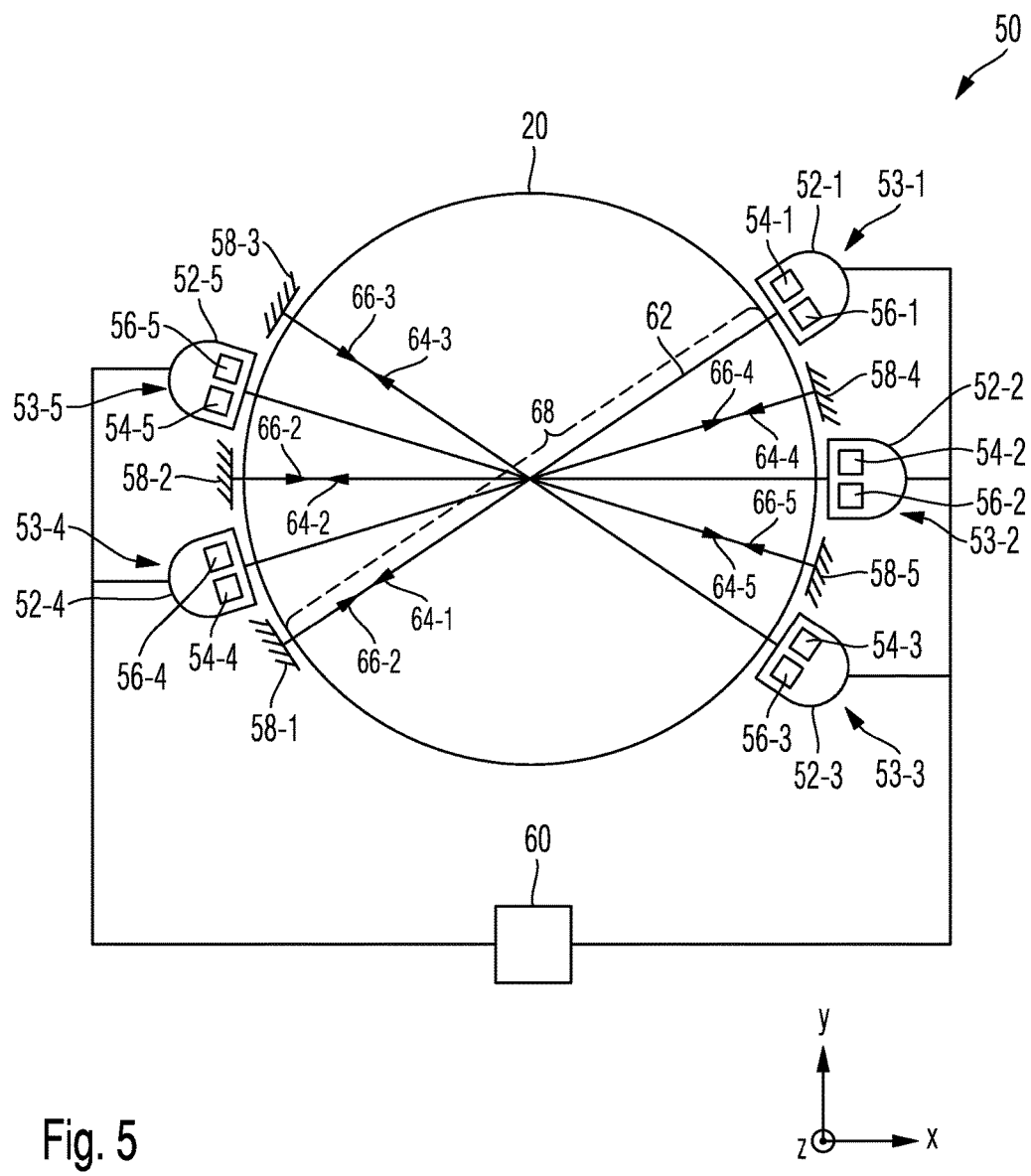
FIG. 5 shows a plan view of the measuring system in the first embodiment according to the invention with a plurality of differently oriented measuring arms each comprising a measuring module and a reflective element.

FIG. 5 shows an embodiment of the measuring system 50 in accordance with FIGS. 1 and 4 with five differently oriented measuring arms 53-1 to 53-5. The optical path length 68 is depicted by way of example for the measuring arm 53-1. The individual measuring arms 53-1 to 53-5 each comprise a measuring module 52-1, 52-2, 52-3, 52-4 and 52-5, respectively, and a respectively associated reflective element 58-1, 58-2, 58-3, 58-4 and 58-5. Each of the measuring arms 53-1 to 53-5 has an orientation that differs with respect to the rest of the measuring arms. In other words, the measuring radiation 62 emitted by the individual measuring modules 52-1 to 52-5 has respectively different directions 64-1, 64-2, 64-3, 64-4 and 64-5 of incidence. Once again in other words, the directions 64-1 to 64-5 of incidence differ from one another in pairs, but they are all oriented perpendicularly to the optical axis 21 of the optical element 20. In the embodiment illustrated in FIG. 5, the measuring radiation 62 of each of the measuring arms 53-1 to 53-5 passes through the center of the optical element 20.

In order to generate the respective measuring radiation 62, the measuring modules 52-1 to 52-5 comprise respective irradiation units 54-1 to 54-5. The irradiation units 54-1 to 54-5 together form a so-called irradiation device. After respective reflection of the measuring radiation 62 at the respective element 58-1, 58-2, 58-3, 58-4 and 58-5, the measuring radiation is detected by the respective detection unit 56-1, 56-2, 56-3, 56-4 and 56-5. The detection units 56-1 to 56-5 together form a so-called detection device.

As already mentioned above, a respective path length 68 covered by the measuring radiation 62 in the optical element 20 is measured using each of the measuring arms 53-1 to 53-5. The path length measurements are thereupon evaluated by the evaluation device 60 shown in FIG. 5 to establish a three-dimensionally spatially resolved distribution of the refractive index n in the optical element 20, that is to say that a corresponding value of the refractive index is determined for each volume element of the optical element 20. The evaluation is effected using methods known in computed-tomography metrology. The respective measured optical path length results from a projection of the refractive index of the optical element 20 along the path covered by the measuring radiation 62 for the corresponding direction of incidence in the optical element onto the respective detection unit 56. During the evaluation, a spatially resolved distribution of the refractive index in the optical element 20 is determined by computed-tomographic filtered back projection of the measured path lengths taking account of the respective direction of incidence. Suitable algorithms are known to the person skilled in the art in principle e.g. from the field of medical computed tomography. In accordance with one component, the computed-tomographic back projection is based on the Radon transform known to the person skilled in the art.

As illustrated in FIG. 2, the measurement result is forwarded from the evaluation device 60 to a control device 38 of the projection exposure apparatus 10. The control device compares said measurement result with at least one measurement result recorded at an earlier point in time. In other words, the control device 38 determines a change in the spatially resolved distribution of the refractive index.

On the basis of the ascertained change in the spatially resolved distribution of the refractive index, the control device 38 calculates an actuating signal for a manipulation device 40 of the projection exposure apparatus 10, which signal serves to compensate for the change in the optical property of the measured optical element 20 caused by the change in the spatially resolved distribution of the refractive index. The manipulation device 40 can comprise various manipulators, known to the person skilled in the art, for example elements for translation, rotation and/or tilting of one or a plurality of the optical elements 20 of the projection lens 32.

In accordance with one embodiment, a plurality, in particular all, of the optical elements 20 of the projection lens 32 are monitored tomographically with a respective measuring system 50 during an exposure process of the projection exposure apparatus 10. From the tomographic measurement results, changes in the imaging property of the projection lens 32 are calculated at specific time intervals and are thereupon corrected using the manipulation device 40. The measuring system 50 thus makes it possible to correct lens element aberrations occurring during the exposure process without delay, in particular in real time.

Figure 6:
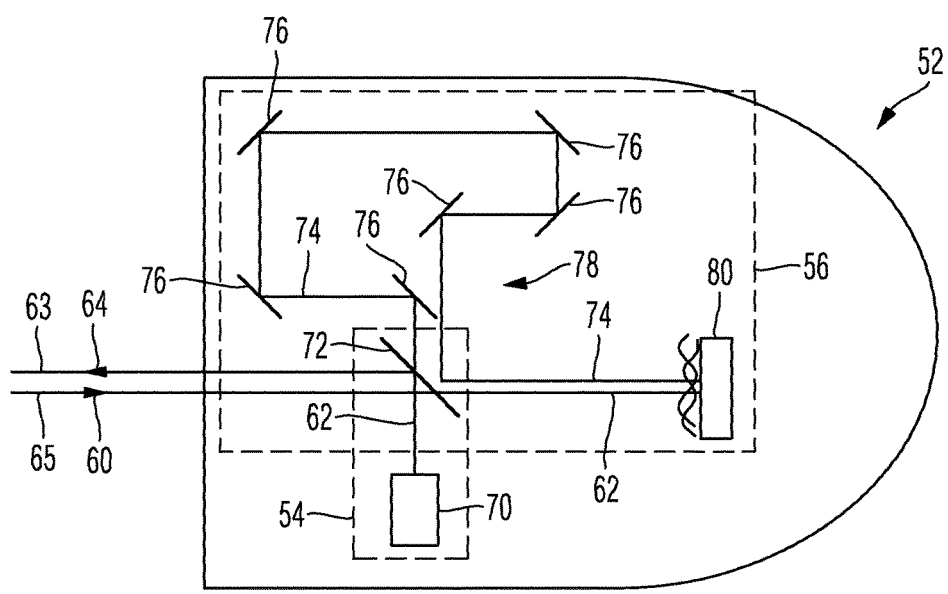
FIG. 6 shows a sectional view through a measuring module in accordance with FIG. 5.

FIG. 6 illustrates an embodiment of the measuring module 52 shown in FIGS. 1 to 5. As already mentioned above, the measuring module 52 comprises an irradiation unit 54 and a detection unit 56. The irradiation unit 54 serves to radiate the measuring radiation 62 onto the optical element 20 in the direction 64 of incidence. For this purpose, the irradiation unit 54 comprises a measuring radiation source 70 and a beam splitter 72. Part of the measuring radiation 62 generated by the measuring radiation source 70 is reflected by the beam splitter 72 and passes toward the optical element 20 as incoming measuring radiation 63 in the direction 64 of incidence. The unreflected part of the measuring radiation 62 passes through the beam splitter 72 and serves as reference radiation 74. The detection unit 56 comprises the beam splitter 72, a plurality of deflection mirrors 76 and a detector camera 80, for example in the form of a CCD camera. The deflection mirrors 76 are arranged for guiding the reference radiation 74 along a reference path back to the beam splitter 72. The reference path thus begins at the beam splitter 72 with the passage of the unreflected measuring radiation 62 and ends again at the beam splitter 72, where part of the arriving reference radiation 74 is reflected toward the detector camera 80.

The measuring radiation 63 reflected at the beam splitter 72 passes through the optical element 20, as already described above, is reflected at the reflective optical element 58 and, after passing through the optical element 20 once again, enters into the measuring module 52 again as returning measuring radiation 65. In this case, the returning measuring radiation 65 impinges on the beam splitter 72. That portion of the measuring radiation 65 which passes through the beam splitter 72 interferes with the reference radiation 74 reflected at the beam splitter 72 on the surface of the detector camera 80. The optical path length of the reference path is co-ordinated with the optical path length of the measuring radiation 62. The optical path length of the measuring radiation 62 is determined by the optical length of the path of the measuring radiation, which begins with the reflection of the measuring radiation 62 at the beam splitter 72 and ends at the beam splitter 72 once again after double passage through the optical element 20. The optical path length of the measuring radiation defined in this way includes twice the optical path length 68 within the optical element 20 as defined above with reference to FIG. 5, and the remaining path distances outside the optical element 20. If the optical path length of the measuring radiation 64 changes, for example on account of lens heating, then this becomes apparent in the interference pattern recorded by the detector camera 80. The path lengths outside the optical element 20 are assumed to be constant and are known. Furthermore, the approximate path length within the optical element is known. The exact value of the optical path length 68 within the optical element is determined from the recorded interference patterns. The beam splitter 72 together with the deflection mirrors 76 forms an interferometer 78.

Figure 7:
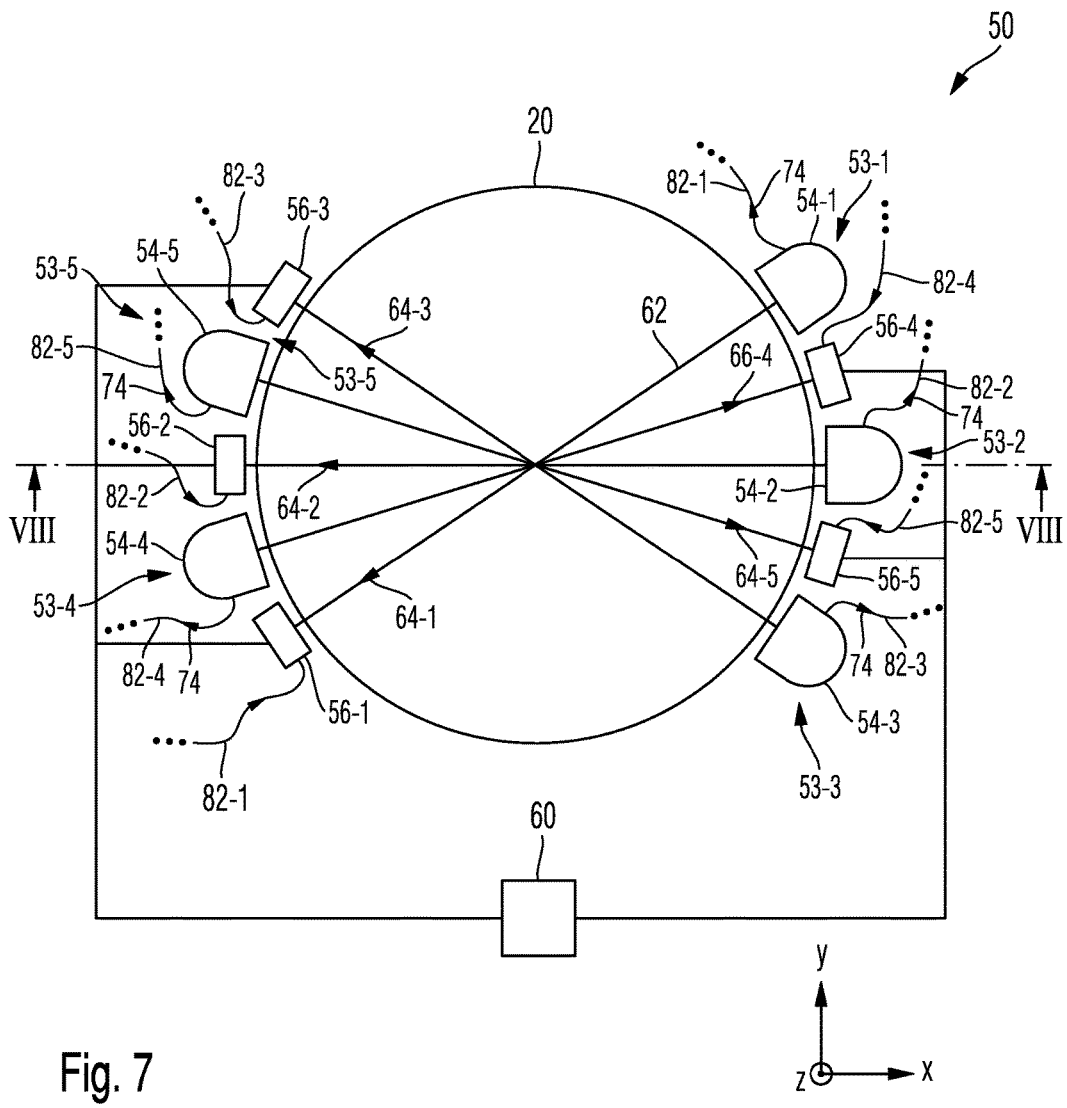
FIG. 7 shows a plan view of a measuring system in a further embodiment according to the invention with a plurality of differently oriented measuring arms each comprising an irradiation unit and a detection unit.

FIG. 7 illustrates a further embodiment of a measuring system 50 according to the invention. This differs from the measuring system 50 in accordance with FIG. 5 in that the measuring radiation 62 in each of the measuring arms 53-1 to 53-5 passes through the optical element 20 only once. Each of the measuring arms 53-1 to 53-5 comprises one of the irradiation units 54-1 to 54-5 and a respective one of the detection units 56-1 to 56-5. The detection units 56-1 to 56-5 are arranged on respectively opposite sides of the optical element 20 with regard to the irradiation units 54-1 to 54-5 respectively assigned to them.

As shown in FIG. 7, the arrangement is fashioned in such a way that the measuring radiation 62 respectively emerging from the irradiation units 54-1 to 54-5 passes through the optical element 20 in different directions 64-1 to 64-5 of incidence. Each of the irradiation units 54-1 to 54-5 is connected to the respectively assigned detection unit 56-1 to 56-5 via an optical fiber 82-1 to 82-5. The respective optical fiber 82-1, 82-2, 82-3, 82-4 and 82-5 in each case guides a reference radiation 74, branched off from the measuring radiation 62 analogously to the arrangement shown in FIG. 6, toward the respective detection unit 56-1, 56-2, 56-3, 56-4 and 56-5. In the respective detection unit 56-1, 56-2, 56-3, 56-4 and 56-5, the reference radiation 74 is superimposed with the measuring radiation 62 after the measuring radiation 62 has passed through the optical element 20 once. A deviation of the optical path length through the optical element 20 from the path length through the optical fiber 82 is determined from the interferogram that arises as a result of superimposition. As in the embodiment in accordance with FIG. 5, the optical path lengths determined by the individual detection units 56-1 to 56-5 are evaluated in the evaluation device 60.

Figure 8:
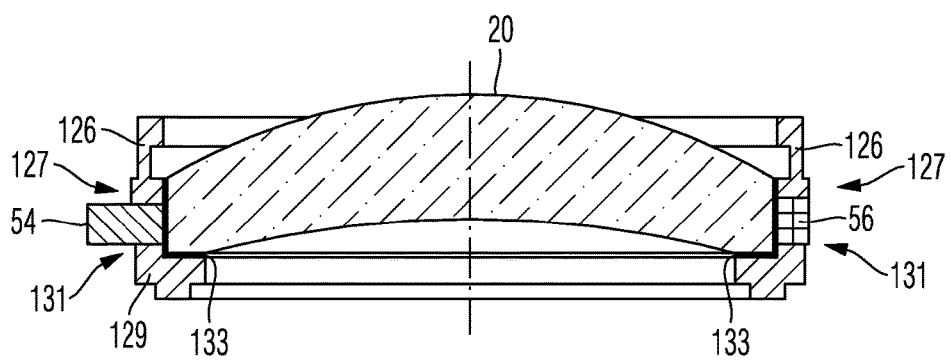
FIG. 8 shows a sectional view of a further embodiment of the lens element mount of the projection exposure apparatus in accordance with FIG. 2 with an irradiation unit, integrated in the lens element mount, and a detection unit, likewise integrated in the lens element mount, of the measuring system in accordance with FIG. 7.

FIG. 8 shows an embodiment of a lens element mount 126 that differs from the embodiment according to FIG. 3. This lens element mount 126 is embodied as an adhesive mount. For this purpose, the lens element mount 126 has a plurality of mount feet 129 on which the optical element 20 bears. The edge of the optical element 20 is surrounded by a side wall 127 of the lens element mount 126. For the purpose of better fixing, the optical element 20 is adhesively bonded into the lens element mount 126 in the region of the side wall 127 and the respective mount foot 129 via adhesive feet 133. The side wall 127 has a multiplicity of cutouts 131, wherein the cutouts 131 are arranged such that they are respectively opposite in pairs with regard to the optical element 20. Firstly an irradiation unit 54 and secondly a detection unit 56 of a respective one of the measuring arms 53-1 to 53-5 are arranged in respectively mutually opposite cutouts 131.

Figure 9:
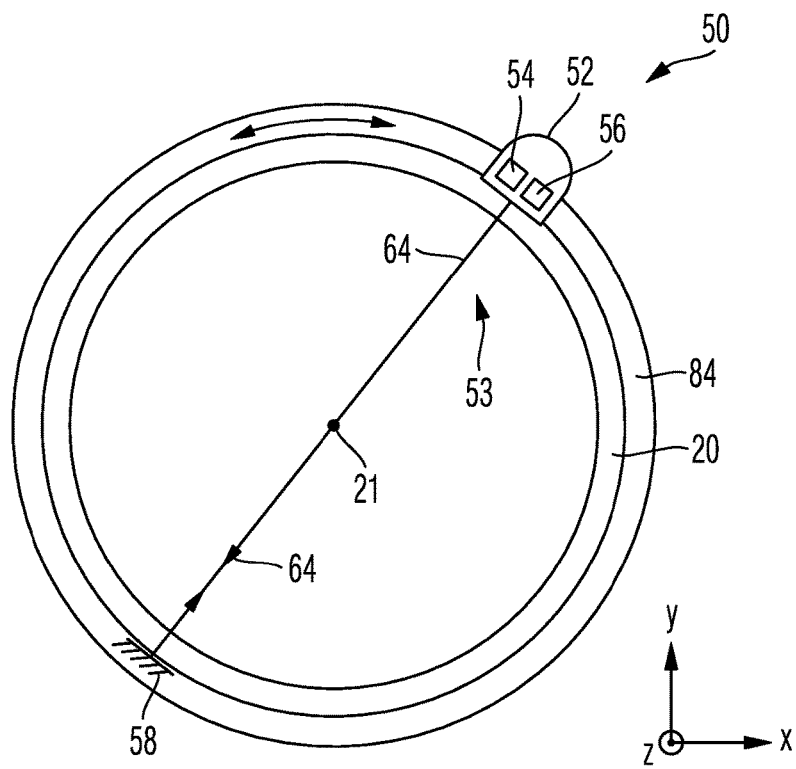
FIG. 9 shows a plan view of a measuring system in a further embodiment according to the invention with a rotatably mounted measuring arm.

FIG. 9 shows a further embodiment of a measuring system 50 for measuring an optical element 20. In this embodiment, the measuring system 50 comprises only one measuring arm 53, which consists of an integrated measuring module 52 and a reflective element 58 in the embodiment illustrated. Alternatively, the measuring arm 53 can also be configured analogously to the measuring arms 53-1 to 53-5 shown in FIG. 7, that is to say with a separate irradiation unit 54 and a separate detection unit 56.

Analogously to the embodiment in accordance with FIG. 5, the integrated measuring module 52 shown in FIG. 9 comprises an irradiation unit 54 and a detection unit 56. The measuring module 52 and the reflective element 58 are fixed on a rotary support structure 84 in the form of a rotatable ring. In this case, the rotary support structure 84 is mounted rotatably with respect to the optical axis 21 of the optical element 20. For the purpose of measuring the optical element 20, the rotary support structure 84 is arranged in different rotary positions, such that the measuring radiation 64 emitted by the measuring module 52 is radiated on to the optical element 20 in different directions 64 of incidence. For each of the directions 64 of incidence, the optical path length of the measuring radiation 64 is measured, as already described above with reference to FIG. 6. Here, too, a three-dimensional spatially resolved distribution of the refractive index of the optical element 20 is determined by tomographic evaluation of the measurement results obtained with the different directions 64 of incidence.

Figure 10:
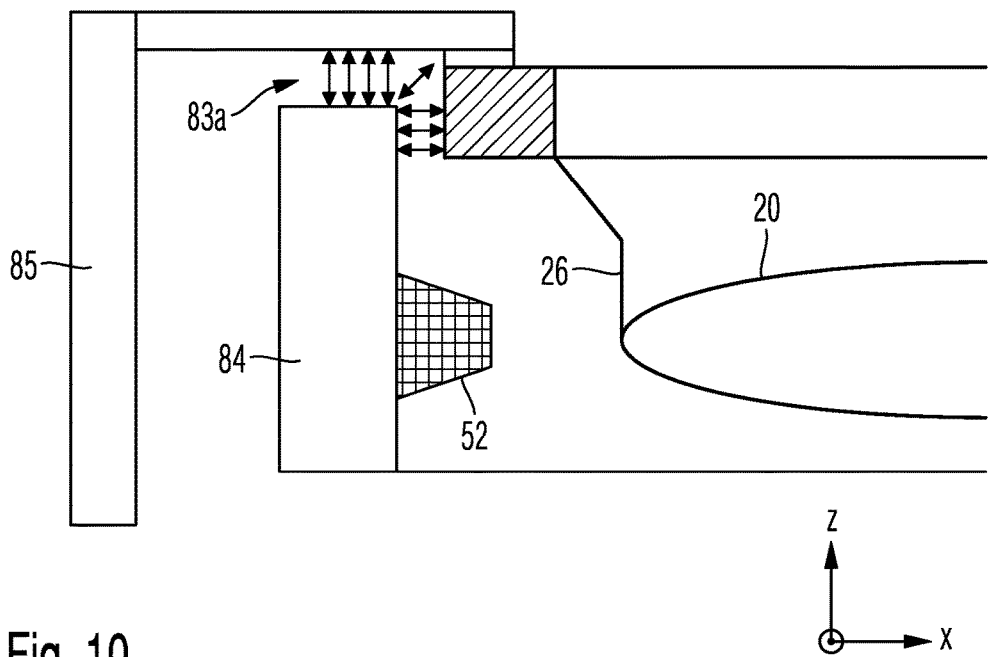
FIG. 10 shows an illustration of a first embodiment of a rotary bearing for the measuring arm in accordance with FIG. 9.
Figure 11:
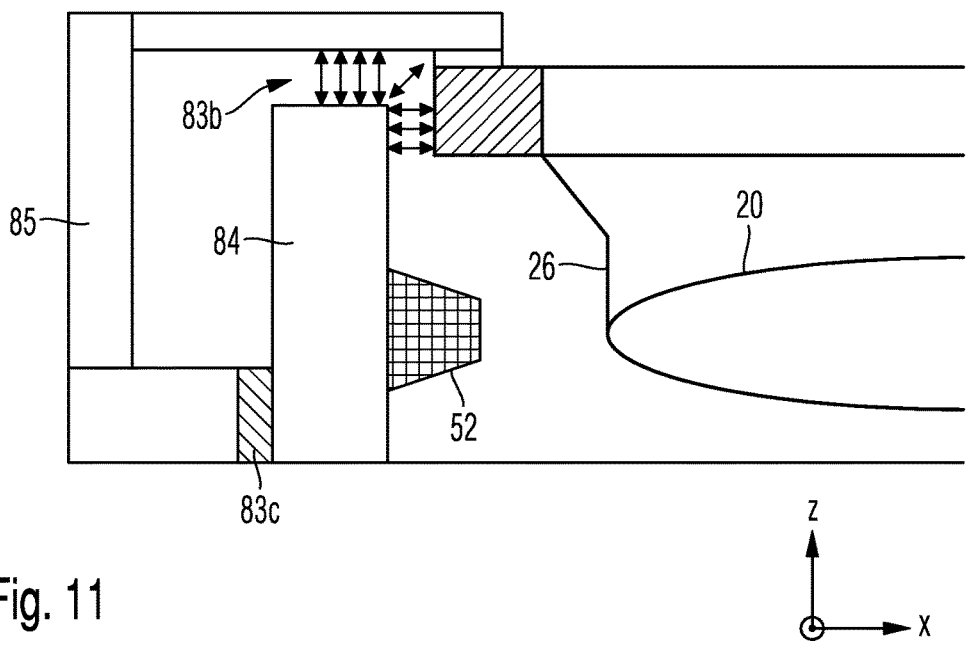
FIG. 11 shows an illustration of a further embodiment of a rotary bearing for the measuring arm in accordance with FIG. 9.

FIGS. 10 and 11 show, in sectional view, different possibilities for mounting the rotary support structure 84 in accordance with FIG. 9. In the embodiment in accordance with FIG. 10, the rotary support structure 84 is mounted on a frame 85 of the projection lens 32 in accordance with FIG. 1 using a drive bearing 83a. The lens element mount 26 for the mounting of the optical element 20 is fixed to the frame 85. The drive bearing 83a is embodied as a magnetic bearing. The magnetic bearing serves for contactlessly mounting the rotary support structure on the frame 85. Furthermore, the drive bearing 83a comprises an ultrasonic motor, also known as a piezoelectric motor. The ultrasonic motor enables the rotary support structure 84 to be rotated about the optical axis 21.

In the embodiment shown in FIG. 11, the rotary support structure 84 is fixed to the frame 85 of the projection lens 32 with a toothed gearing 83c. The rotary support structure 84 is mounted rotatably relative to the lens element mount 26 with an air bearing 83b.

Figure 12:
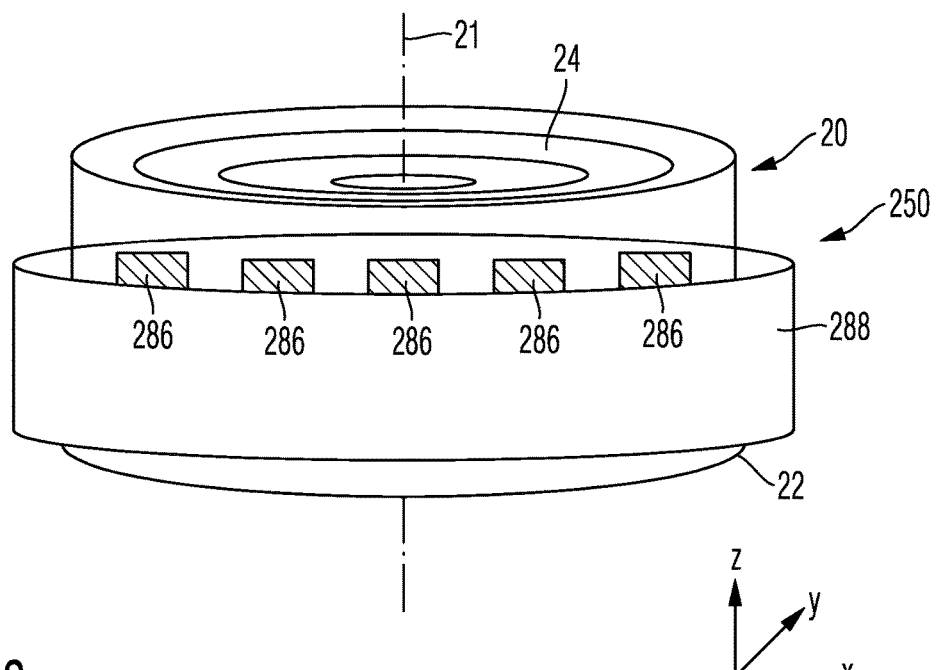
FIG. 12 shows a perspective illustration of an optical element of a projection exposure apparatus for microlithography with a measuring system for measuring the optical element in a further embodiment according to the invention.

FIG. 12 shows an embodiment of a further measuring system 250 according to the invention for measuring an optical element 20. The optical element 20 can be a mirror element, as illustrated in FIG. 12. Such a mirror element comprises, as already shown in FIG. 4, a mirror substrate 22 and a reflective coating 24. However, an optical lens element in accordance with FIG. 1 is also suitable as an optical element. The measuring system 250 comprises a multiplicity of infrared sensors 286 arranged along the circumference of the optical element 20. The infrared sensors 286 are surrounded by a shield 288 in the form of a cylindrical shielding plate that is opaque to infrared radiation.

Figure 13:
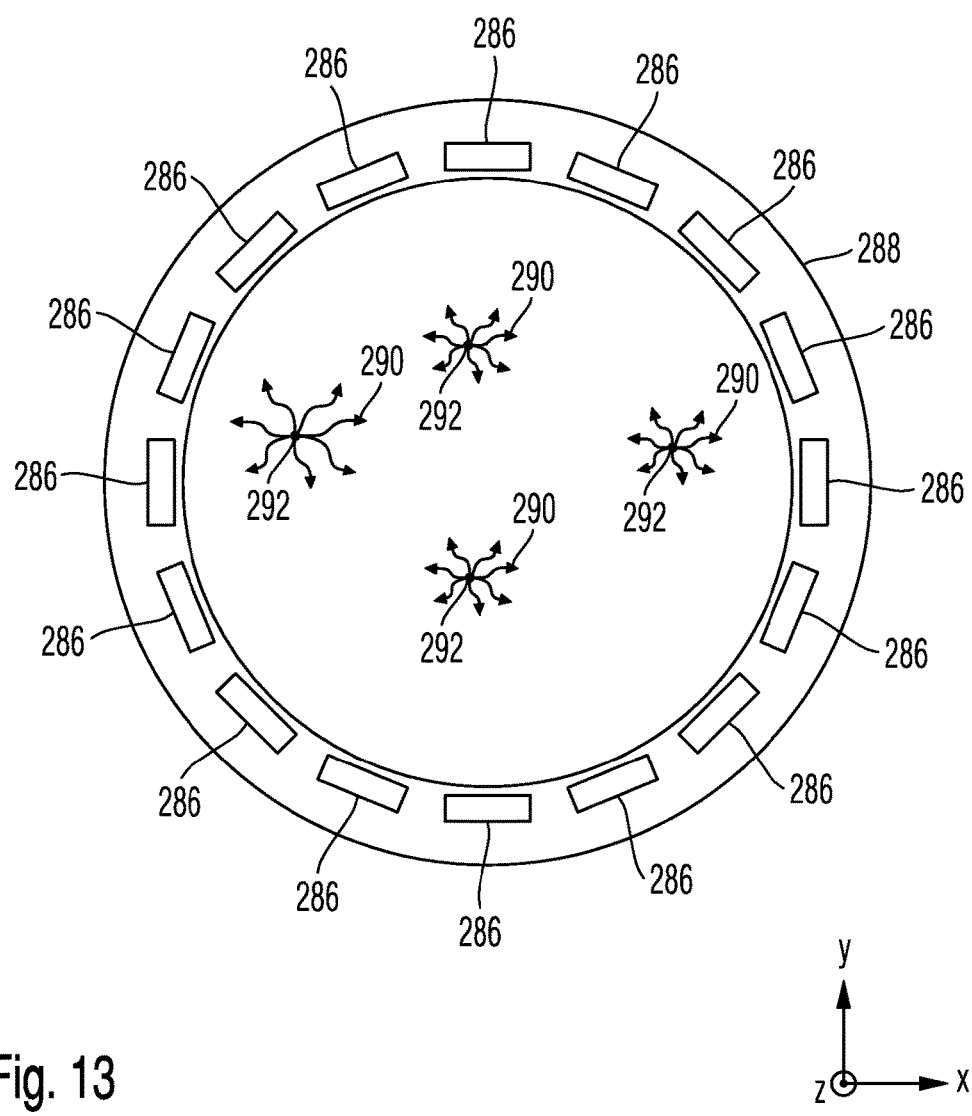
FIG. 13 shows a plan view of the measuring system in accordance with FIG. 12.

As illustrated in FIG. 13, each volume element 292 of the optical element 20 emits infrared radiation 290 in all spatial directions. The intensity of the infrared radiation 290 emitted at the respective volume element 292 is proportional to the fourth power of the temperature in the corresponding volume element 292. The infrared sensors 286 arranged along the circumference of the optical element 20 measure the intensity of infrared radiation respectively arriving on their detection surface. By evaluating all the intensity values measured by the various infrared sensors 286, a three-dimensional spatially resolved distribution of the temperature in at least one section of the optical element 20 is determined using tomographic evaluation methods, in particular the Radon transform. From the temperature distribution determined, changes in the refractive index in the optical element 20 in comparison with an isotropic temperature distribution are determined. From these in turn, deviations of the optical imaging property of the projection lens relative to an earlier measurement are determined. These measurements are thereupon corrected utilizing a manipulation device 40, as already explained with reference to FIG. 2.

These and other features and embodiments of the invention are described in the claims as well as in the specification and the drawings. The individual features may be implemented either alone or in combination as embodiments of the invention. Further, they may represent advantageous embodiments that are protectable in their own right, for which protection is claimed in the application as filed or for which protection may be claimed during pendency of this application and/or continuing applications. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

LIST OF REFERENCE SIGNS

10 Projection exposure apparatus for microlithography
12 Radiation source
14 Exposure radiation
16 Illumination optical unit
18 Mask
20 Optical element
21 Optical axis
22 Mirror substrate
23 Edge region
24 Reflective coating
25 Gap
26 Lens element mount
27 Side wall
28 Adjustable clamping jaw
29 Fixed clamping jaw
30 Bearing ball
31 Cutout
32 Projection lens
34 Substrate
36 Substrate stage
38 Control device
40 Manipulation device
50 Measuring system
52 Integrated measuring module
53 Measuring arm
54 Irradiation unit
56 Detection unit
58 Reflective element
60 Evaluation device
62 Measuring radiation
63 Incoming measuring radiation
64 Direction of incidence
65 Returning measuring radiation
66 Return direction
68 Optical path length
70 Measuring radiation source
72 Beam splitter
74 Reference radiation
76 Deflection mirror
78 Interferometer
80 Detector camera
82 Optical fiber
83a Drive bearing
83b Air bearing
83c Toothed gearing
84 Rotary support structure
85 Frame of the projection lens
126 Lens element mount
127 Side wall
129 Mount foot
131 Cutout
133 Adhesive foot
250 Measuring system
286 Infrared sensor
288 Shield
290 Infrared radiation
292 Volume element

The invention claimed is:
1. An apparatus comprising:
a projection exposure apparatus for microlithography comprising:
an illumination optical unit for illuminating a mask with exposure radiation;
a projection lens;
an optical element being part of the illumination optical unit or the projection lens; and
a measuring system for measuring the optical element,
wherein the measuring system comprises:
a measuring irradiation device, configured to radiate measuring radiation in different directions onto the optical element, such that the measuring radiation covers respective optical path lengths within the optical element for the different directions of incidence,
a detection device, configured to determine, for the respective directions of incidence, the respective optical path lengths covered by the measuring radiation in the optical element from detection of the measuring radiation, and
an evaluation device, configured to determine a spatially resolved distribution of refractive indices in the optical element by computed-tomographic back projection of the respective determined path lengths with respect to the respective directions of incidence.

2. The apparatus according to claim 1,
wherein the evaluation device is further configured to project the respective determined path lengths back onto a volume region of the optical element through which the measuring radiation passes, and thereby to determine a three-dimensionally spatially resolved distribution of the refractive indices in the optical element.

3. The apparatus according to claim 1,
wherein the measured optical element is a lens element.

4. The apparatus according to claim 1,
wherein the measuring system is configured to measure the optical element in at least two different directions extending transversely with respect to the optical axis of the optical element.

5. The apparatus according to claim 1,
wherein the measuring system is configured to determine from the measurements a spatially resolved temperature distribution in at least one section of the optical element.

6. The apparatus according to claim 1,
wherein the detection device comprises an interferometer configured to determine the optical path length by superimposing the measuring radiation after traversing one of the optical path lengths in the optical element with a reference radiation.

7. The apparatus according to claim 1,
wherein the irradiation device comprises a plurality of irradiation units each configured and arranged to emit the measuring radiation in one of the different directions of incidence, wherein the directions of incidence of the different irradiation units differ from one another in pairs.

8. The apparatus according to claim 1,
wherein the detection device comprises a plurality of detection units each configured to determine the optical path length for a respective one of the different directions of incidence, wherein the directions of incidence assigned to the different detection units differ from one another in pairs.

9. The apparatus according to claim 1,
which comprises at least one integrated measuring module configured to radiate the measuring radiation onto the optical element in one of the different directions and to measure the measuring radiation returning in a direction opposite to the direction of incidence.

10. The apparatus according to claim 1,
which comprises at least one irradiation unit configured to radiate the measuring radiation onto the optical element and a detection unit configured to determine the optical path length covered by the measuring radiation in the optical element, wherein the irradiation unit and the detection unit are arranged on mutually opposing sides of the optical element.

11. The apparatus according to claim 1,
wherein the irradiation device comprises an irradiation unit configured to emit the measuring radiation and the detection device comprises a detection unit assigned to the irradiation unit and configured to determine the path length covered by the measuring radiation in the optical element, wherein the measuring system furthermore comprises a rotary bearing, to which the irradiation unit and the detection unit are fixed, and the rotary bearing is configured such that, in different rotary positions of the rotary bearing, the measuring radiation emitted by the irradiation unit is radiated onto the optical element in the different directions, and the detection unit is arranged and configured to measure the measuring radiation emitted by the irradiation unit in the respective rotary position.

12. The apparatus according to claim 1,
wherein the optical element is a mirror element comprising a substrate and a coating for reflecting EUV radiation; and
wherein the measuring radiation emitted by the measuring irradiation device has a wavelength at which the substrate of the mirror element is to be a large extent transparent.

13. An apparatus, comprising:
a projection exposure apparatus for microlithography comprising:
a radiation source generating exposure radiation;
a projection lens;
an optical element being part of the illumination optical unit or the projection lens; and
a measuring system for measuring the optical element,
wherein the measuring system comprises:
a measuring irradiation device, configured to radiate measuring radiation in different directions onto the optical element, such that the measuring radiation covers respective optical path lengths through at least one section of the optical element for the different directions of incidence,
a detection device, configured to determine, for the respective directions of incidence, the respective optical path lengths covered by the measuring radiation in the optical element from detection of the measuring radiation, and
an evaluation device, configured to determine a three-dimensionally spatially resolved distribution of a property of the optical element from the respective determined path lengths with respect to the respective directions of incidence.

14. The apparatus according to claim 13,
wherein the measured optical element is a lens element.

15. The apparatus according to claim 13,
wherein the measuring system is configured to measure the optical element in at least two different directions extending transversely with respect to the optical axis of the optical element.

16. The apparatus according to claim 13,
wherein the measuring system is configured to determine from the measurements a spatially resolved temperature distribution in at least one section of the optical element.

17. The apparatus according to claim 13,
wherein the detection device comprises an interferometer configured to determine the optical path length by superimposing the measuring radiation after traversing one of the optical path lengths in the optical element with a reference radiation.

18. The apparatus according to claim 13, wherein the irradiation device comprises a plurality of irradiation units each configured and arranged to emit the measuring radiation in one of the different directions of incidence, wherein the directions of incidence of the different irradiation units differ from one another in pairs.

19. The apparatus according to claim 13, wherein the detection device comprises a plurality of detection units each configured to determine the optical path length for a respective one of the different directions of incidence, wherein the directions of incidence assigned to the different detection units differ from one another in pairs.

20. The apparatus according to claim 13,
which comprises at least one integrated measuring module configured to radiate the measuring radiation onto the optical element in one of the different directions and to measure the measuring radiation returning in a direction opposite to the direction of incidence.

21. The projection exposure apparatus according to claim 13,
which comprises at least one irradiation unit configured to radiate the measuring radiation onto the optical element and a detection unit configured to determine the optical path length covered by the measuring radiation in the optical element, wherein the irradiation unit and the detection unit are arranged on mutually opposing sides of the optical element.

22. The apparatus according to claim 13,
wherein the irradiation device comprises an irradiation unit configured to emit the measuring radiation and the detection device comprises a detection unit assigned to the irradiation unit and configured to determine the path length covered by the measuring radiation in the optical element, wherein the measuring system furthermore comprises a rotary bearing, to which the irradiation unit and the detection unit are fixed, and the rotary bearing is configured such that, in different rotary positions of the rotary bearing, the measuring radiation emitted by the irradiation unit is radiated onto the optical element in the different directions, and the detection unit is arranged and configured to measure the measuring radiation emitted by the irradiation unit in the respective rotary position.

23. An apparatus comprising:
a projection exposure apparatus for microlithography comprising:
an optical element and
a measuring system, wherein the measuring system comprises at least one infrared sensor configured to measure a respective intensity of an infrared radiation emerging from the optical element from different directions, and the measuring system is configured to:
  i. determine from the measurements a three dimensioned spatially resolved distribution of a property of the optical element in at least a section of the optical element using tomographic evaluation methods,
  ii. determine changes in the refractive index in the optical element in comparison with an isotropic distribution of the property of the optical element, and
  iii. determine deviations of an optical imaging property of the projection lens relative to an earlier measurement from the determined changes in the refractive index in the optical element.

24. The projection exposure apparatus according to claim 23,
further comprising a manipulation device configured to change an optical property of the projection exposure apparatus and a control device, wherein the control device is configured to change the optical property with the manipulation device based on the spatially resolved distribution of the measured property of the optical element.

25. A method comprising:
measuring an optical element of a projection exposure apparatus for microlithography, wherein the measuring comprises:
  radiating measuring radiation onto the optical element, in different directions, such that the measuring radiation covers respective optical path lengths through at least one section of the optical element for the different directions of incidence,
  for the respective directions of incidence, determining the respective optical path length covered by the measuring radiation in the optical element, and
  determining a spatially resolved distribution of the refractive index in the optical element by computed-tomographic back projection of the respective determined path lengths with respect to the respective directions of incidence.

* * * * *

UNITED STATES PATENT AND TRADEMARK OFFICE
CERTIFICATE OF CORRECTION

PATENT NO. : 10,162,270 B2
APPLICATION NO. : 14/449629
DATED : December 25, 2018
INVENTOR(S) : Bleidistel et al.

Page 1 of 1

It is certified that error appears in the above-identified patent and that said Letters Patent is hereby corrected as shown below:

In the Claims

Column 17, Line 15 In Claim 23, delete "element" and insert -- element; --, therefor.

Signed and Sealed this
Thirtieth Day of July, 2019

Andrei Iancu
*Director of the United States Patent and Trademark Office*